(12) United States Patent
Greenberg

(10) Patent No.: US 6,961,689 B1
(45) Date of Patent: Nov. 1, 2005

(54) SCHEDULING NON-INTEGRAL SIMULATION TIME FOR MIXED-SIGNAL SIMULATION

(75) Inventor: Steven S. Greenberg, Beaverton, OR (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 09/531,350

(22) Filed: Mar. 21, 2000

(51) Int. Cl.$^7$ ............................ G06F 7/62; G06F 17/50
(52) U.S. Cl. .................... 703/17; 703/4; 703/13; 703/14; 703/16
(58) Field of Search ................... 703/17, 14, 4, 703/13, 16

(56) References Cited

U.S. PATENT DOCUMENTS

| | | | | |
|---|---|---|---|---|
| 5,481,484 A | | 1/1996 | Ogawa et al. ............... | 364/578 |
| 5,737,583 A | | 4/1998 | Jones et al. ................. | 395/500 |
| 5,794,005 A | * | 8/1998 | Steinman ..................... | 703/17 |
| 5,850,538 A | * | 12/1998 | Steinman ..................... | 703/21 |
| 6,110,217 A | * | 8/2000 | Kazmierski et al. .......... | 703/14 |
| 6,208,954 B1 | * | 3/2001 | Houtchens .................... | 703/16 |
| 6,324,495 B1 | * | 11/2001 | Steinman ..................... | 703/17 |
| 6,466,898 B1 | * | 10/2002 | Chan ........................... | 703/17 |

OTHER PUBLICATIONS

Premal Buch, Ernest S. Kuh, "SYMPHONY: A Fast Signal Simulator for BiCMOS Analog/Digital Circuits", IEEE 1996, pp. 403-407.*
Ernst G. Ulrich, "Non-Integral Event Timing for Digital Logic Simulation", ACM 1976, pp. 61-67.*
Microsoft Press Computer Dictionary Third Edition, Mircosoft Press, 1997 pp. 229 and 230.*
C.W. Rose, M. Albarran, "Modeling And Design Description of Hierarchical Hardware/Software Systems*" Advanced Research Projects Agency, ACM, Jan. 1975, pp. 421-430.*
Ernst G. Ulrich, "Non-Integral Event Timing for Digital Logic Simulation", 1976, pp. 61-68.
IEEE Computer Society, "IEEE Standard VHDL Analog and Mixed-Signal Extensions", Dec. 23, 1999, pp. 118-123 and 173-175 (for reference only; not to be disclosed in IDS).
Timothy A. Budd, "Classical Data Structures in C++", Jun. 1994, pp. 355-379.
Ernst G. Ulrich, "Exclusive Simulation of Activity in Digital Networks", Feb. 1969, pp. 102-110.
Manjikian N. et al., "Using split event sets to form and schedule event combination in discrete event simulation", Simulation Symposium, 1992, Proceedings., 25$^{th}$ Annual Orlando Fl. USA Apr. 6-9, 1992, Los Alamitos, CA, USA, IEEE COMPU. SOC, US, pp. 184-191.

(Continued)

Primary Examiner—Kevin J. Teska
Assistant Examiner—Dwin M. Craig
(74) Attorney, Agent, or Firm—Silicon Valley Patent Group LLP

(57) ABSTRACT

In the simulation of an analog and mixed-signal analog-digital physical circuit, events are assigned scheduled times. The events are stored in buckets in a hash table, with the scheduled times of the events in each bucket associated with the bucket. The scheduled times are organized into a heap, with the earliest scheduled time at the root of the heap. The earliest scheduled time is removed from the heap, and the events in the associated bucket are performed. Performing the scheduled events can cause new events to be scheduled, and existing events to be de-scheduled. When all the events in the bucket associated with the earliest scheduled time are simulated, the remaining scheduled times are re-organized into a new heap, and the steps of removing the earliest scheduled time, performing the scheduled events, and re-organizing the remaining scheduled times are repeated.

18 Claims, 12 Drawing Sheets

OTHER PUBLICATIONS

Schof S., "Efficient Data Structures For Time Warp Simulation Queues", Journal of Systems Architecture, Elsevier Science Publishers BV., Amsterdam, NL. vol. 44, No. 6-7, Mar. 1, 1998, pp. 497-517.

Prasad S.K. et al., "Using parallel data structures in optimistic discrete event simulation of varying granularity on shared-memory computers", Algorithms and Architectures For Parallel Processing, 1995, ICAPP 95, IEEE First ICAPP., IEEE First International Conference on Brisbane, OLD., Australia Apr. 19-21, 1995, pp. 565-374.

Hidaka, S. et al. "Logical Process Scheduling using Heap Data Structure in Parallel Discrete Event Simulation", The Institute of Electronics Information and Communication Engineers, Technical Report of IEICE, CPSY98 71 (Aug. 1998), pp. 81-87 (including English-language abstract and reference list).

European Search Report from corresponding European application No. EP 00 30 5129 (4 pages total) dated Mar. 1, 2004.

Japanese Office Action from corresponding Japanese application No. 2000-183529 (6 pages total including 3 pages of translation), dated Mar. 10, 2004.

* cited by examiner

SCHEDULING NON-INTEGRAL SIMULATION TIME FOR MIXED-SIGNAL SIMULATION

This invention was made with government support under cooperative agreement F30602-96-2-0309 awarded by the Air Force. The Government has certain rights in the invention.

FIELD OF THE INVENTION

The present invention relates to the field of computer simulation of analog and mixed signal digital-analog physical circuits and systems, and more particularly to the scheduling of non-integral times for simulation events.

BACKGROUND OF THE INVENTION

In simulating digital systems to verify both their functional behavior and their timing behavior, speed of simulation is one of the most important factors. One of the key ways of speeding up simulation is for the simulation to selectively trace only the activity in the model. This selective trace occurs in two dimensions. One dimension is the model. At any given simulation time, the simulator expends no effort on the parts of the model that are not changing. The other dimension is time. Ideally, the simulator only expends effort at the simulation times at which activity occurs.

To achieve these efficiencies, activity is broken down into events that occur at specific times. As the model creates these events, it is crucial that the simulator efficiently store these events for processing at the specified simulation times and efficiently retrieve them when the simulator progresses to that simulation time. Typically, data structures and algorithms that are an implementation of a time wheel are used to accomplish this. One of the features of the time wheel is its ability to give the simulator, in one operation, the entire list of all events at the next simulation time at which an event occurs.

Each slot in the time wheel represents one unit of minimum resolvable time. A modulo operation on the simulation time is used to find the proper slot in which to place an event. Simulation time is advanced by finding the next slot in the time wheel that has a non-empty event list. The order of complexity of the modulo operation is a constant in computer time. The cost of testing each empty slot is significant enough that it is important to minimize the number of empty slots. Minimization is done by choosing a minimum resolvable time that is small enough to get the desired accuracy in time, but large enough to minimize the number of empty slots. From the simulator's point of view, it is most convenient if this minimum resolvable time is known at the beginning of simulation. Otherwise, provision must be made for re-organizing the time wheel as simulation progresses. This re-organization is very expensive.

Another difficulty is deciding the size of the time wheel. It must be large enough to cover the largest delay in the model. This assures that two different times do not have to occupy the same slot in the time wheel at the same time. This can limit the size of delay that can be modeled in a given amount of computer memory. The other options are to manage different times in the same slot or to manage a separate list of events that are far in the future. Either of these last two options introduces complexity and inefficiency into the simulator.

Simulators can operate efficiently if the minimum resolvable time can be discerned at model compilation time. There is a much less efficient mode of simulation if the minimum resolvable time can vary during the simulation.

During the analog parts of the simulation, the minimum resolvable time is determined by the simulator as the time increment required to solve the algebraic-differential equations of the model accurately. At different times during simulation, the minimum resolvable time can vary by many orders of magnitude. This minimum resolvable time can sometimes act as a delay that needs to be scheduled. At the interface from analog to digital simulation, there are threshold crossings that need to be scheduled. The times of these threshold crossings are at analog time resolution.

FIG. 9 shows the sequence of steps involved in performing a simulation. At step 905, the design description is assembled. The design description includes any kind of input that describes the design to be simulated. It can include models describing physical devices and a netlist (a list of model instances and their interconnections and parameters). Models and the netlist can be expressed as text or in compiled form. At step 910, the simulatable model is assembled. This takes the design description and converts it into a collection of data structures and executable code that can be used by the core simulator to analyze the performance of the model representing the design to be simulated. At step 915, the core simulator simulates the model. The core simulator computes the performance of the mixed analog/digital model in the domains of time and frequency. Finally, at step 920, the post-processor allows the user to inspect the simulation results, for example in a graphical viewer, and to process the results according to selected criteria.

FIGS. 4A and 4B show the simulation process for simulating an analog and mixed signal digital-analog physical circuit or system. The simulation process shows where events are scheduled internal to the system. The simulation process of FIGS. 4A and 4B is akin to the simulation process specified in IEEE Standard VHDL Analog and Mixed-Signal Extensions, IEEE Std 1076.1-1999, § 12.6.4, and is similar to the simulation performed by SABER.

In FIGS. 4A and 4B, at step 405, the simulator checks to see if there are more events to simulate. If there are scheduled times remaining, then there are more events to simulate. At step 410, assuming events remain to be simulated, scheduled analog events are handled. There are three kinds of analog events: arriving at the left boundary of a discontinuity, where the model to be simulated has executed a break; arrival at the right boundary of a discontinuity; and arrival at the time of the projected analog solution. At step 415, signals are updated. Updating signals includes propagating value changes to the signals. At step 420, processes are resumed. A process is a set of procedural steps in the hardware description language provided by the user. Processes can handle user signal changes, and can assign values to a signal. Assigning a value to a signal causes an event to be scheduled. At step 425, the timeslot is checked to see if it has ended. Because events can be scheduled with a zero delay (in other words, events can be added to be simulated immediately), the timeslot must be checked before the simulator can conclude that all scheduled events have been simulated. At step 430, assuming the end of the timeslot has been reached, postponed processes are resumed. A postponed process is a special process set to execute as a time change occurs. At step 435, the simulator checks to see if an analog projection is required. An analog projection is required if the previous analog projection only projected to the current scheduled time. If an analog projection is required, at step 440 the next analog solution is projected. Finally, at step 445, the time of the next analog/digital events is retrieved.

When there is a discernible minimum resolvable time, the simulation time can be represented as an integer. But when the delay between scheduled simulation times can be both very small and very large (i.e., the minimum resolvable time can vary), the time must be represented as a real number (non-integer). This, too, affects the complexity of the time wheel.

Accordingly, a need exists for a way to control the timing of event simulation that is not dependent on a fixed minimum resolvable time, and that allows for effectively unbounded growth in the number of scheduled times for simulation events.

SUMMARY OF THE INVENTION

A simulator models analog and mixed signal digital-analog physical circuits and systems in a digital computer. According to the invention, the simulator assigns scheduled times to the events. Using a non-order preserving hash function, the events are placed in buckets in a hash table. Events that hash to the same bucket but are at different times are placed within different lists in the bucket. The scheduled times for the events in each bucket are associated with each bucket by the hash function. The scheduled times for the events are organized in a heap. The simulator removes the earliest scheduled time from the heap, locates the associated bucket, finds the appropriate list within the bucket, and performs the events in the event list. The remaining scheduled times are re-organized into a new heap, and the process repeats until the heap is empty.

The foregoing and other objects, features and advantages of the invention will become more readily apparent from the following detailed description of a preferred embodiment, which proceeds with reference to the drawings.

DETAILED DESCRIPTION

The time wheel used previously is a hash table that preserves order and has a fixed interval between times in the wheel (i.e., the places in the hash table). The time values are stored in sorted order by using a modulo hashing function. The price paid for that sorted order is the need to process empty slots to get to the next time slot with events.

According to the invention, a non-order preserving hash function is used. The problem of having to determine a minimum resolvable time for managing the empty slot problem is thereby eliminated. Long delays also will not require special processing. The hash function places events into buckets according to their scheduled times (the buckets thereby forming the hash table), but the buckets themselves have no assigned order.

A heap priority queue enables the tracking of times in the scheduler. The heap priority queue allows easy locating of the next event time. The heap priority queue restores the ordering capability lost by going to a non-order preserving hash table.

A hash table bucket contains a list of event lists. Each event list is labeled with the simulation time of the events in the list. When there are collisions of different simulation times hashing to the same bucket, the mechanism of lists labeled with the scheduled time keeps it sorted out.

The use of a non-order preserving hash table and a heap priority queue creates a uniform scheme whose efficiency does not depend on the relative sizes of the minimum and maximum delays. The amount of memory used by the scheme depends on the number of events and unique times. Nor does the amount of memory used depend on the sizes of the delays.

Figure 1:
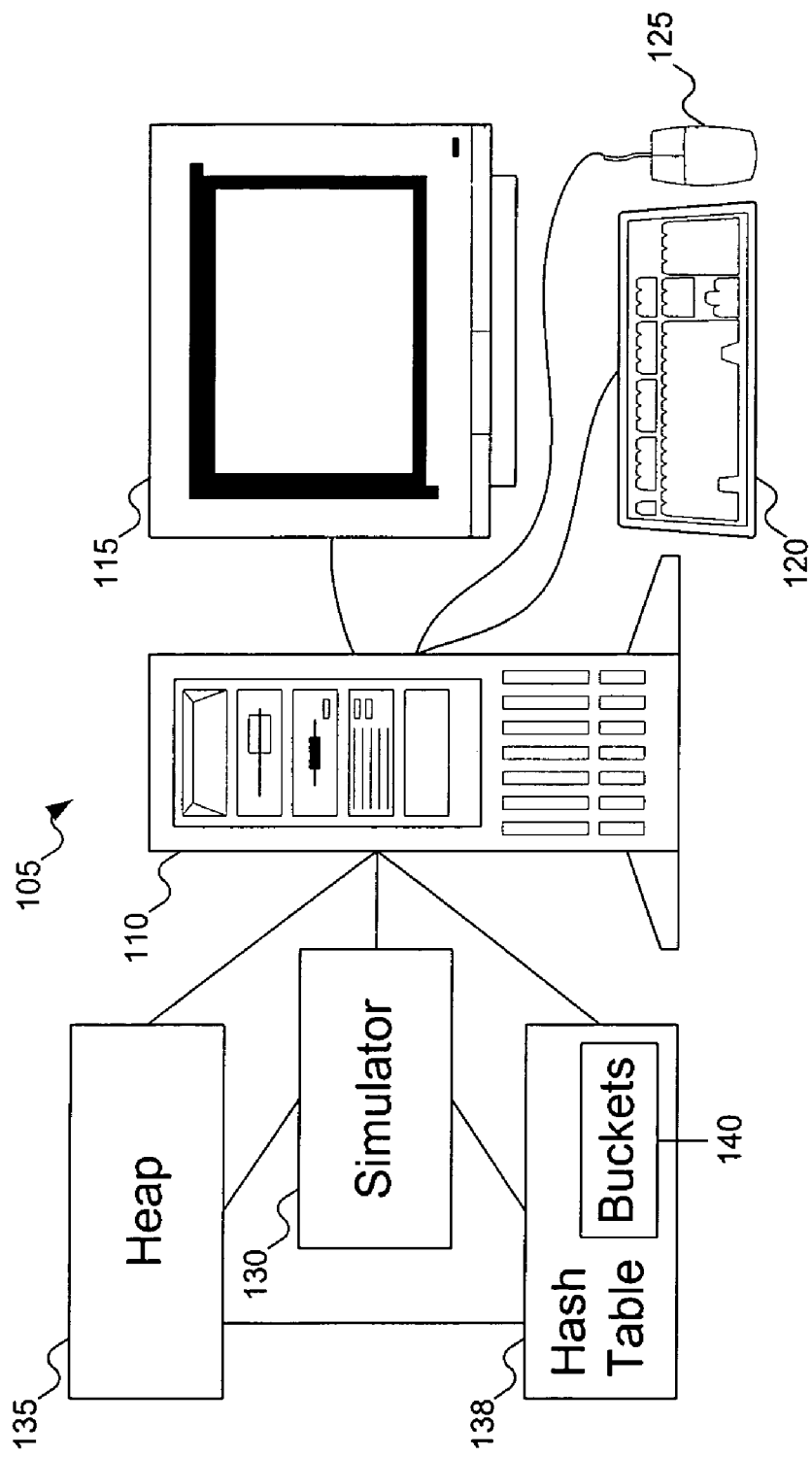
FIG. 1 shows a computer system implementing the method and apparatus of this invention.

FIG. 1 shows a computer system 105 using the method and apparatus of this invention. The computer system 105 includes a computer 110, a monitor 115, a keyboard 120, and a mouse 125. Other components may be part of the computer system 105, even though not shown in FIG. 1. For example, computer system 105 can include other input/output devices, such as a plotting device. Computer system 105 also includes simulator 130. Simulator 130 performs a simulation of analog and mixed signal digital-analog physical circuits and systems.

In the preferred embodiment, the scheduled times for the events to be simulated are stored in a heap. Computer system 105 includes heap 135 for storing the scheduled times in a heap priority queue and hash table 138 for storing event lists of events to be simulated at given scheduled times. Buckets 140 are part of hash table 138. Buckets 140 store the event lists of the actual events to be simulated. This allows heap 135 to store only the scheduled times for the events to be simulated, simplifying heap management.

Figure 2A:
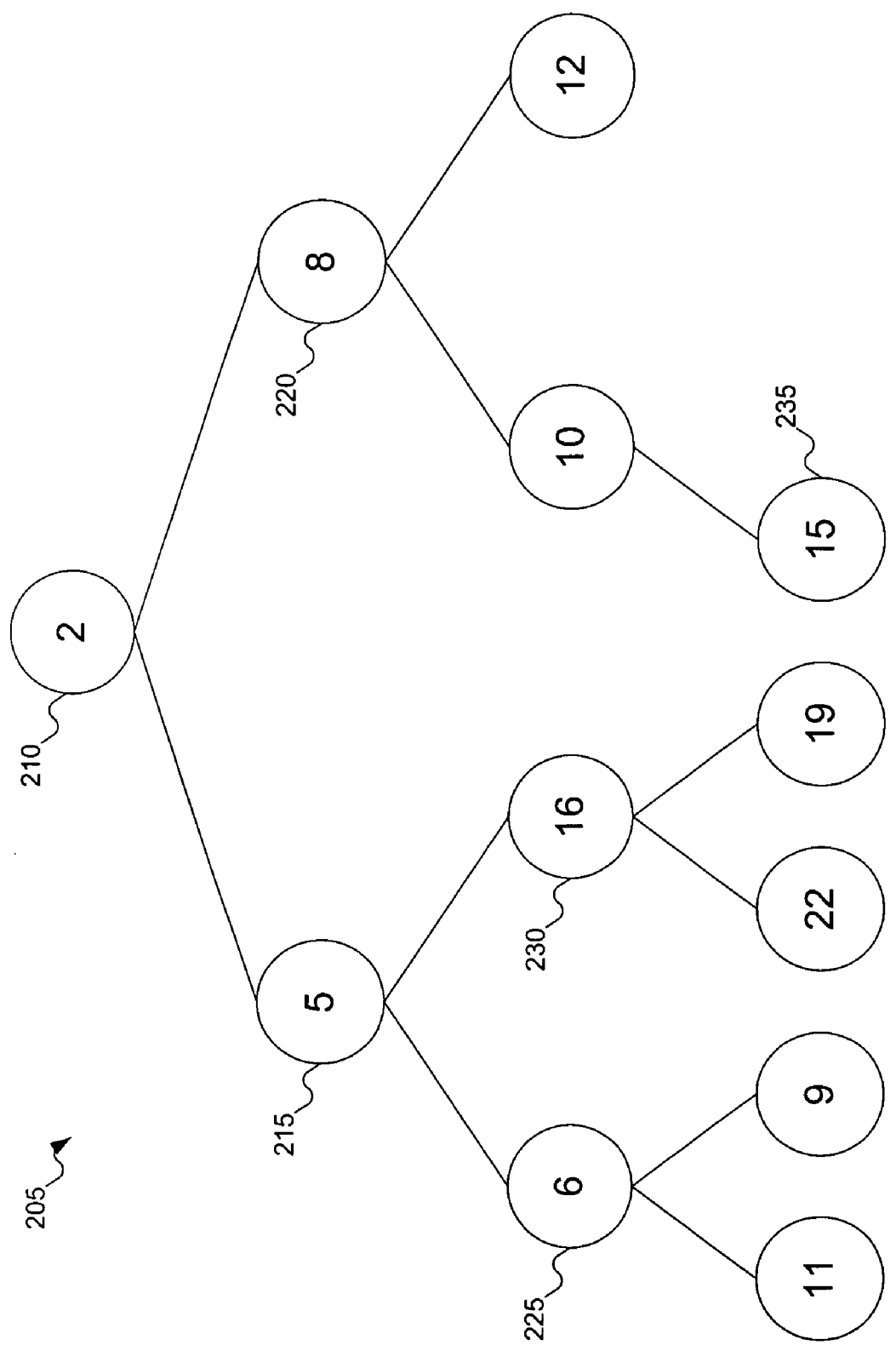
FIGS. 2A and 2B show sample heaps that can be used as the heap of FIG. 1.

FIG. 2A shows a sample heap 205. Heap 205 includes, among other nodes, nodes 210, 215, 220, 225, 230, and 235. A heap is a data structure organized as a binary tree. Nodes in the binary tree are said to have a parent-child relationship. That is, a node in heap 205 that is one level higher than another node is called the parent of the other node, and the other node is called a child of the parent node. In a heap, each parent node is smaller than its two children (this is known as the heap property). For example, node 210 stores the value 2, which is less than the values of nodes 215 (5) and 220 (8), node 215 (5) has a smaller value than nodes 225 (6) and 230 (16), etc. Note that, aside from the requirement that each node in heap 205 be smaller than either of its children nodes, no order is imposed on the heap. So, although node 225, storing the value 6, is in the third row of heap 205, even though node 220, with the value 8, is in row 2 of heap 205. Similarly, node 235 has a smaller value than node 230, but is lower in the heap on the other side of the heap. A heap, such as heap 205, can be called partially ordered.

In the preferred embodiment, heap 205 is left-filled. That is, children nodes are added to the left-most parent of the last complete row in the heap that does not have two children.

Further, if the parent to which the child is to be added has no children, the new child is added as the left child of the parent node. The requirement that heap 205 be left-filled simplifies implementation details, but is not required. Algorithms for constructing a heap from a set of values, for inserting new values into the heap, and for removing values from the heap are known in the art and will not be repeated here.

Figure 2B:
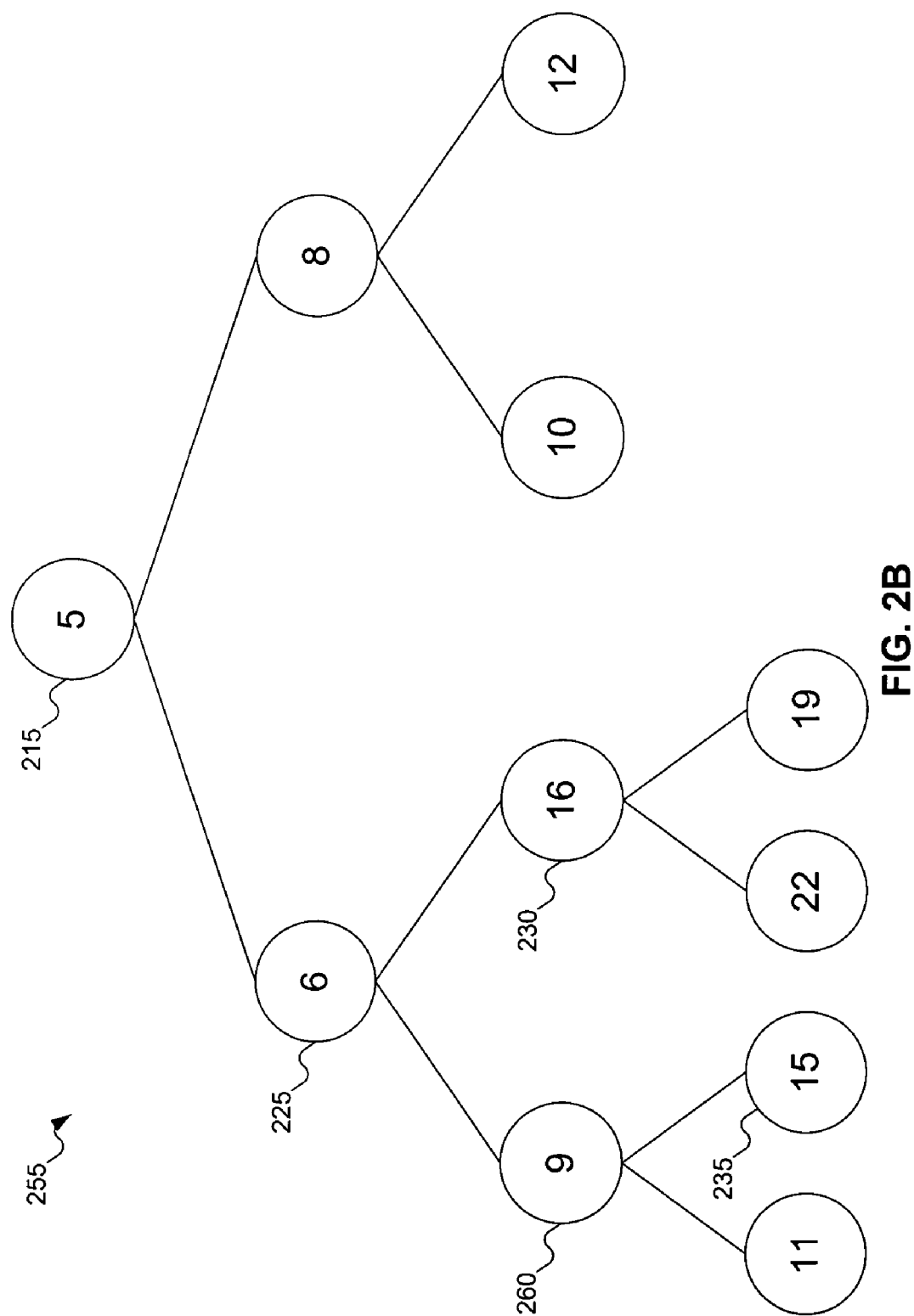

FIG. 2B shows how heap 205 from FIG. 2A can look after the earliest scheduled time is removed from the heap. In heap 255, node 235 has been re-positioned within the heap as a child of node 260. Similarly, nodes 215, 225, and 260 have been re-positioned. Note that heap 255 still satisfies the heap property.

Figure 3A:
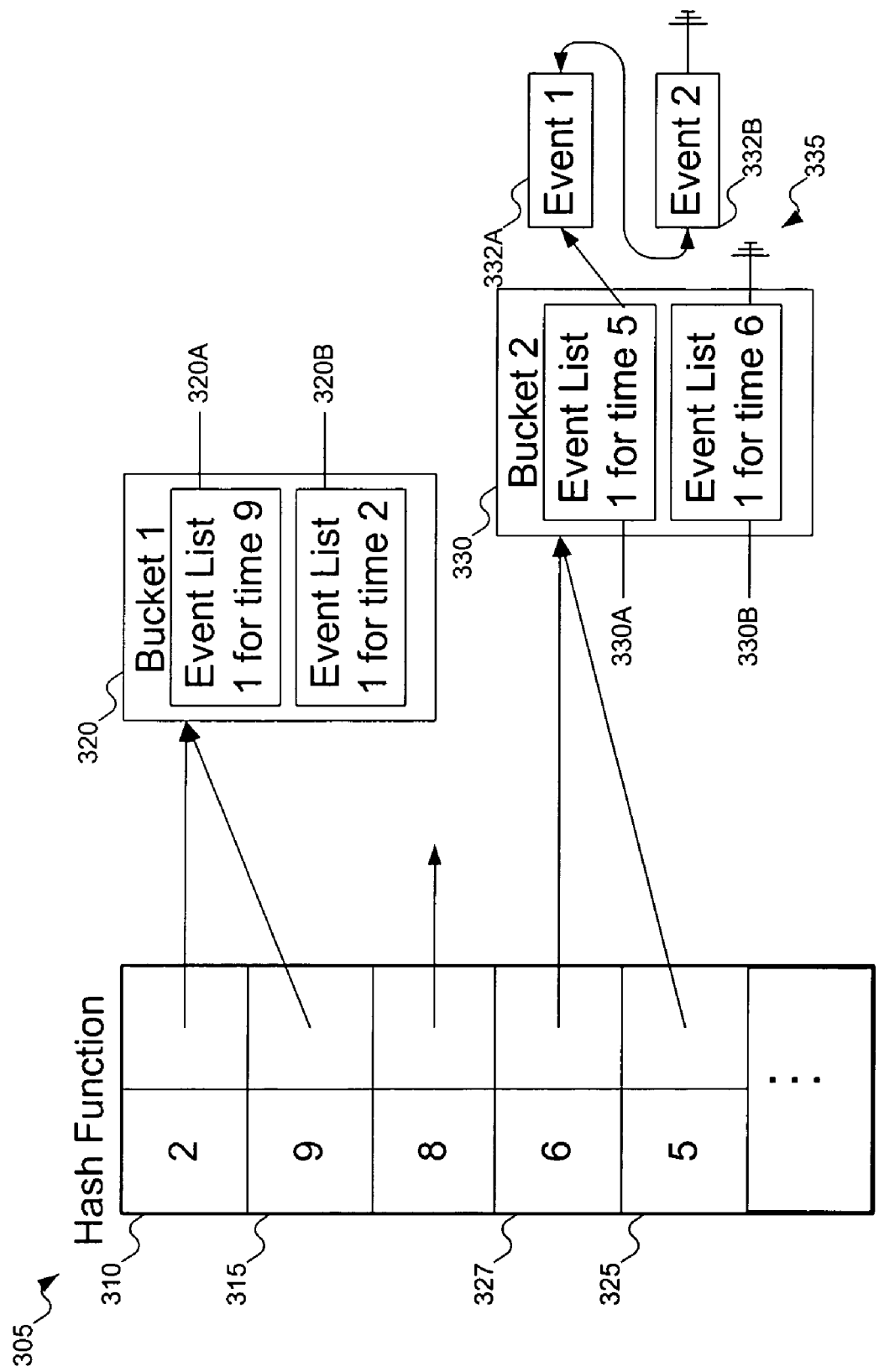
FIGS. 3A and 3B shows a sample hash table that can be used as the hash table of FIG. 1.

FIG. 3A shows a hash table that can accompany heap 205 of FIG. 2A. In FIG. 3A, a hash function 305 maps the times from the heap to buckets. Note that the arrows used to show the mapping of the hash function are a visual convenience: in the preferred embodiment, the hash function takes a time and returns an index of the bucket in the hash table. In FIG. 3A, times 2 (310) and 9 (315) map to bucket 1 (320), and times 5 (325) and 6 (327) map to bucket 2 (330). Bucket 1 (320) has two event lists: one for events occurring at time 9 (320A), and one for events occurring at time 2 (320B). Bucket 2 (330) has two event lists: one for events occurring at time 5 (330A), and one for events occurring at time 6 (330B). Observe that multiple times can map to a single bucket; the scheduled times for the events in the event lists in the bucket identify which events are to occur at which times.

In FIG. 3A, event list 330A shows two events in the list: event 1 (332A) and event 2 (332B). Event list 330B has no events in its event list, represented by null pointer 335. This can occur if there were events originally scheduled for time 6 (332), but these events were de-scheduled. In the preferred embodiment, the event list is a doubly linked list, which can be traversed in either direction.

Figure 3B:
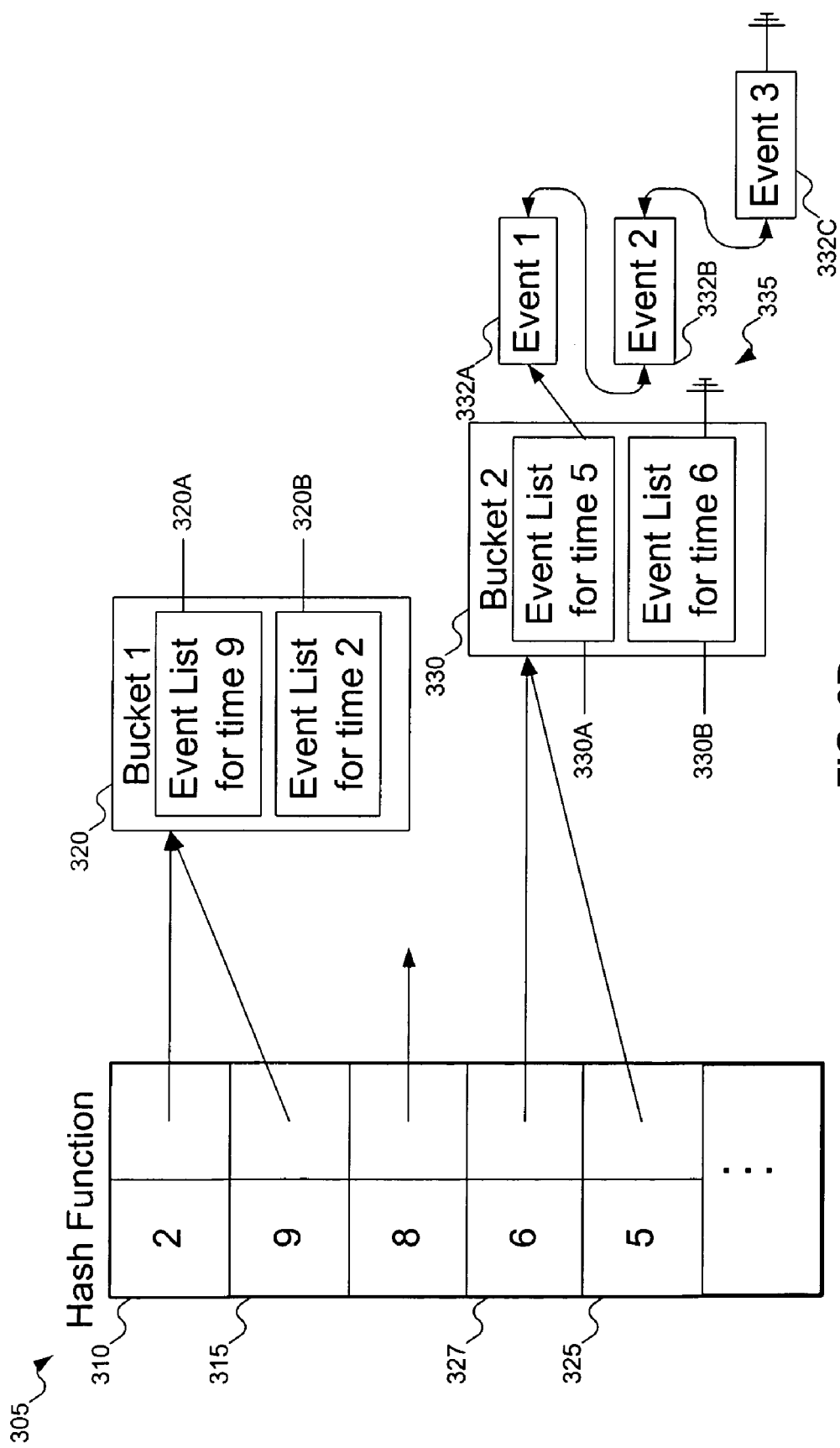

FIG. 3B shows the hash table of FIG. 3A after a new event has been scheduled. In FIG. 3B, a new event has been scheduled for time 5 (325). Hash function 305 maps time 5 (325) to bucket 2 (330). Since an event list already exists for time 5 (325) in bucket 2 (330), a new event 332C is added to event list 330B.

Figure 7:
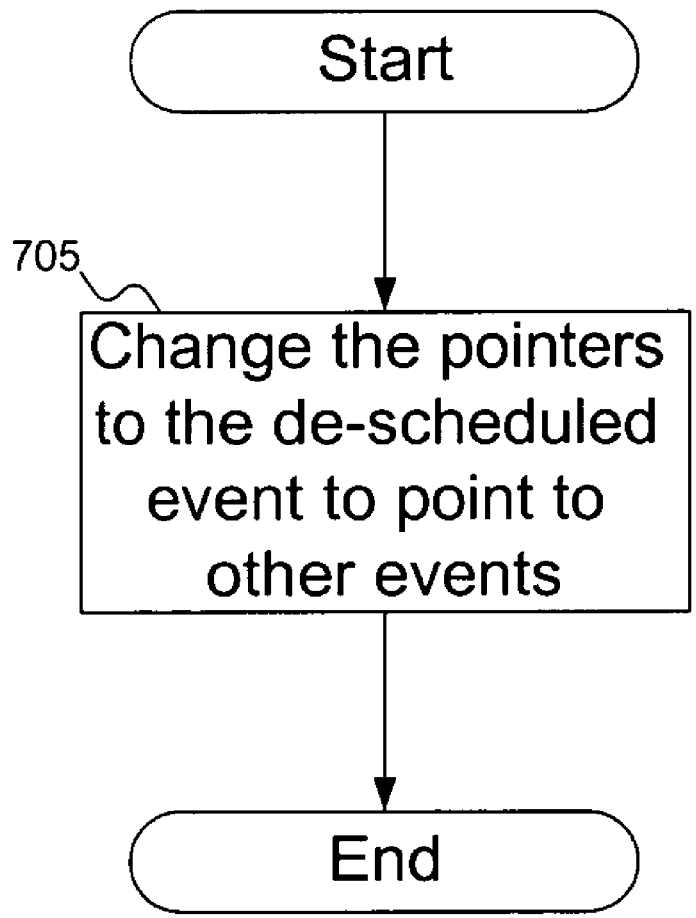
FIG. 7 shows how events can be de-scheduled from the heap of FIG. 1.

In the preferred embodiment, events know their location within the event list. De-scheduling an event requires only changing the pointers of events before and after the de-scheduled event in the event list. FIG. 7 shows this process. At step 705, the pointers to the de-scheduled event from the prior and next event in the event list are changed, de-scheduling the event. (Note that, even if the event list for the de-scheduled event's scheduled time is empty, in the preferred embodiment the scheduled time is not removed from the heap.) However, in an alternative embodiment, events can be de-scheduled from event lists by using hash function 305 to locate the bucket containing the event list for the time of the event to be de-scheduled, accessing the appropriate event list within the bucket, and removing the event.

If no event list exists for the time for which an event is being added, the scheduled time can be inserted into the heap. How this new scheduled time is inserted into the heap is discussed with reference to FIG. 6 below.

Figure 4A:
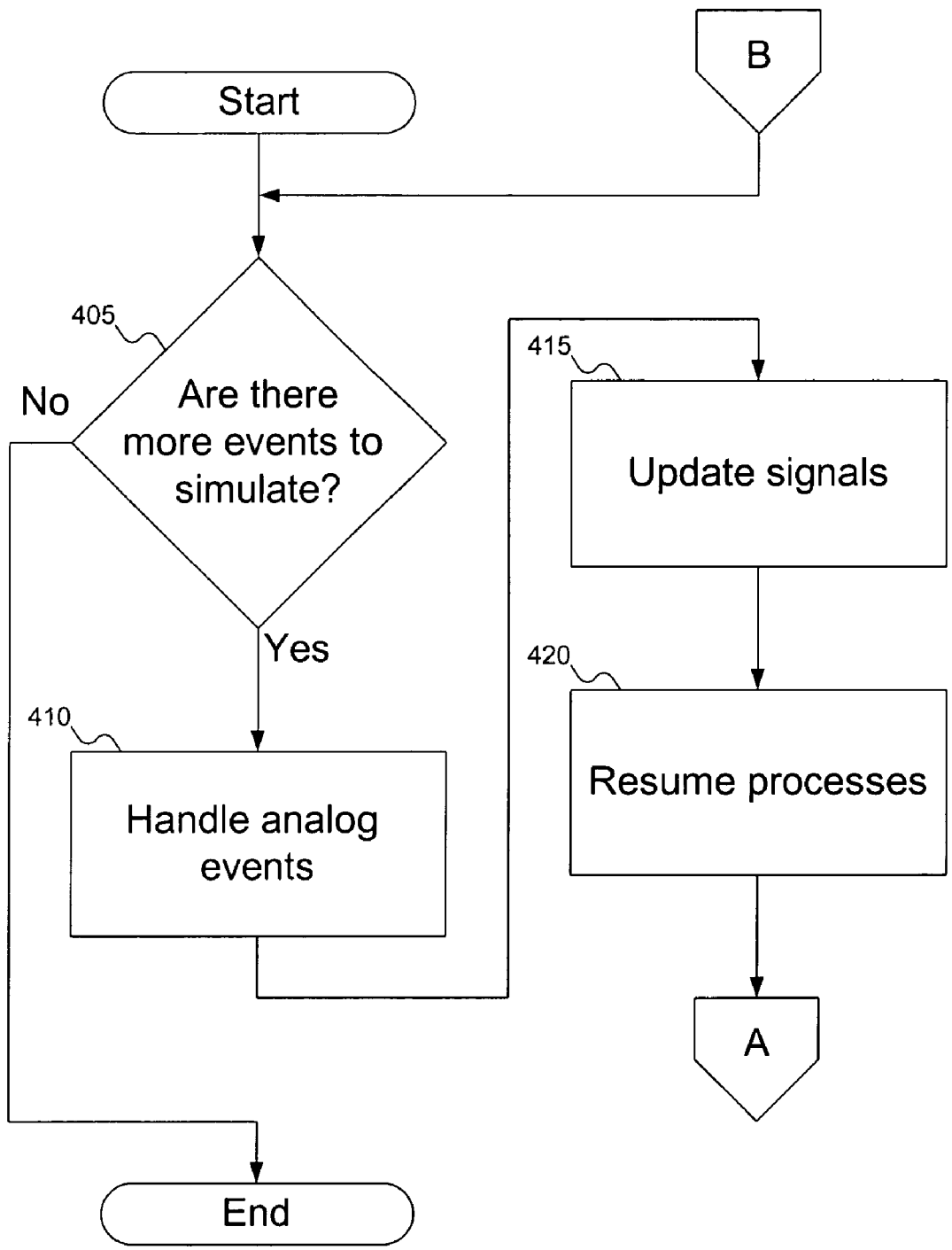
FIGS. 4A and 4B show in greater detail the prior art simulation process of FIG. 9.
Figure 4B:
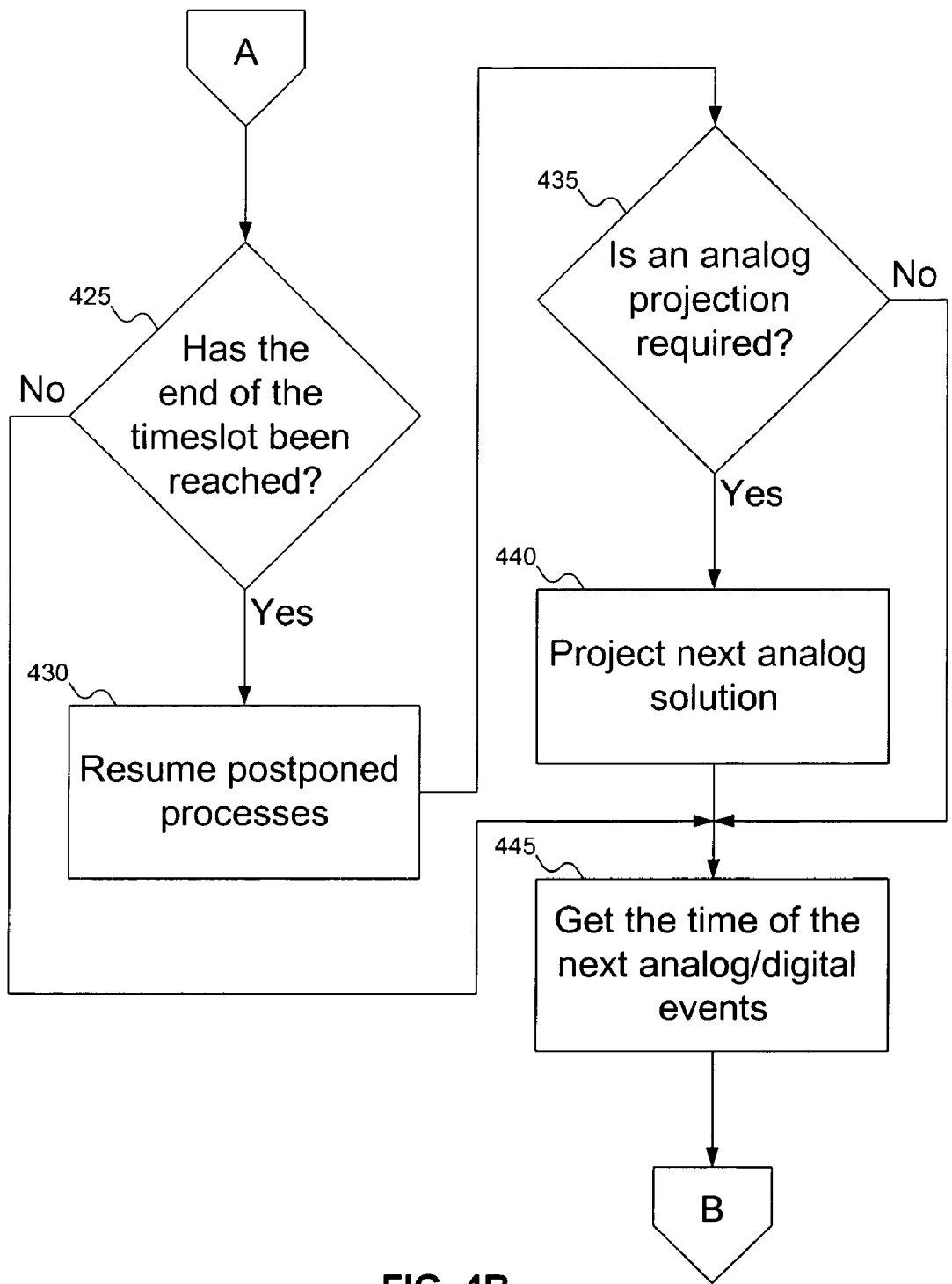

The invention can work with the simulator shown in FIGS. 4A and 4B. At step 405, whether any events remain to be simulated is determined by checking the heap. If the heap still holds any scheduled times, events remain to be simulated. New events can be scheduled at steps 420, 430, and 440. However, a person skilled in the art will recognize that any system requiring event scheduling, and not simulation, can benefit from the invention. For example, callbacks (the execution of software routines at pre-determined scheduled times) can be organized using the invention.

Figure 5:
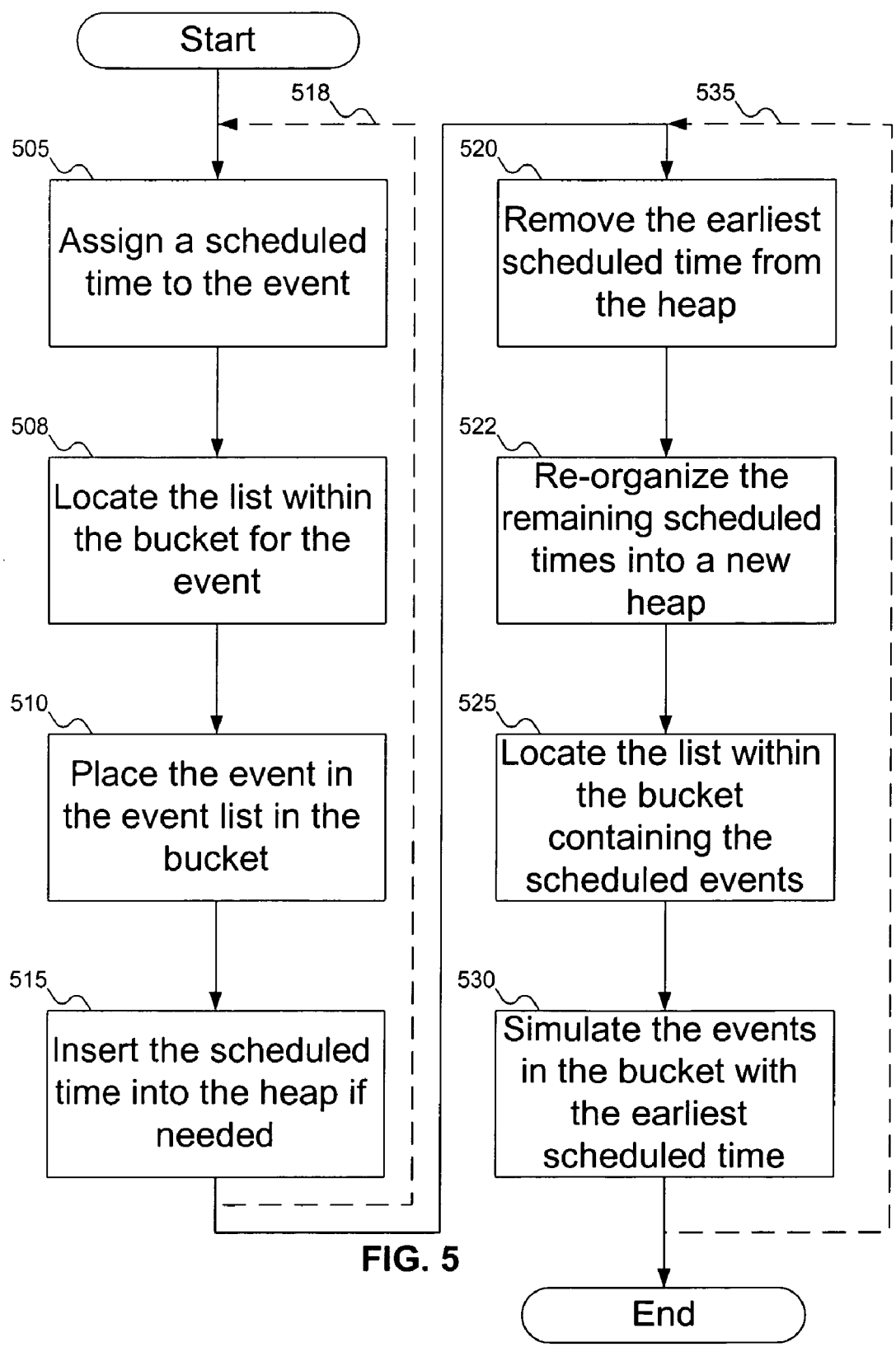
FIG. 5 shows how events are placed in and removed from the heap of FIG. 1.

FIG. 5 shows how the heap and buckets are managed outside the context of simulation. At step 505, an event is assigned a scheduled time. At step 508, the bucket storing the event list into which the event is to be added is located. The hash function uses the scheduled time of the event to locate the appropriate bucket. At step 510, the event is added to the event list in the appropriate bucket. At step 515, the event's scheduled time is inserted into the heap, if needed (the event's scheduled time may have been added to the heap earlier). Inserting the event's scheduled time into the heap includes ensuring that, after the event's scheduled time is inserted, the heap retains the heap property. As shown by dashed line 518, steps 505, 508, 510, and 515 can be repeated for as many events as necessary. Once the heap has been built, at step 520, the earliest scheduled time is removed from the heap. Removing the earliest scheduled time includes ensuring that the heap retains the heap property after the earliest scheduled time is removed. This is shown at step 522. At step 525, the bucket containing the events scheduled for the earliest time is located. Finally, at step 530, the events scheduled for the earliest scheduled time are simulated. As shown by dashed line 535, steps 520, 522, 525, and 530 can be repeated until the heap is emptied.

Figure 6:
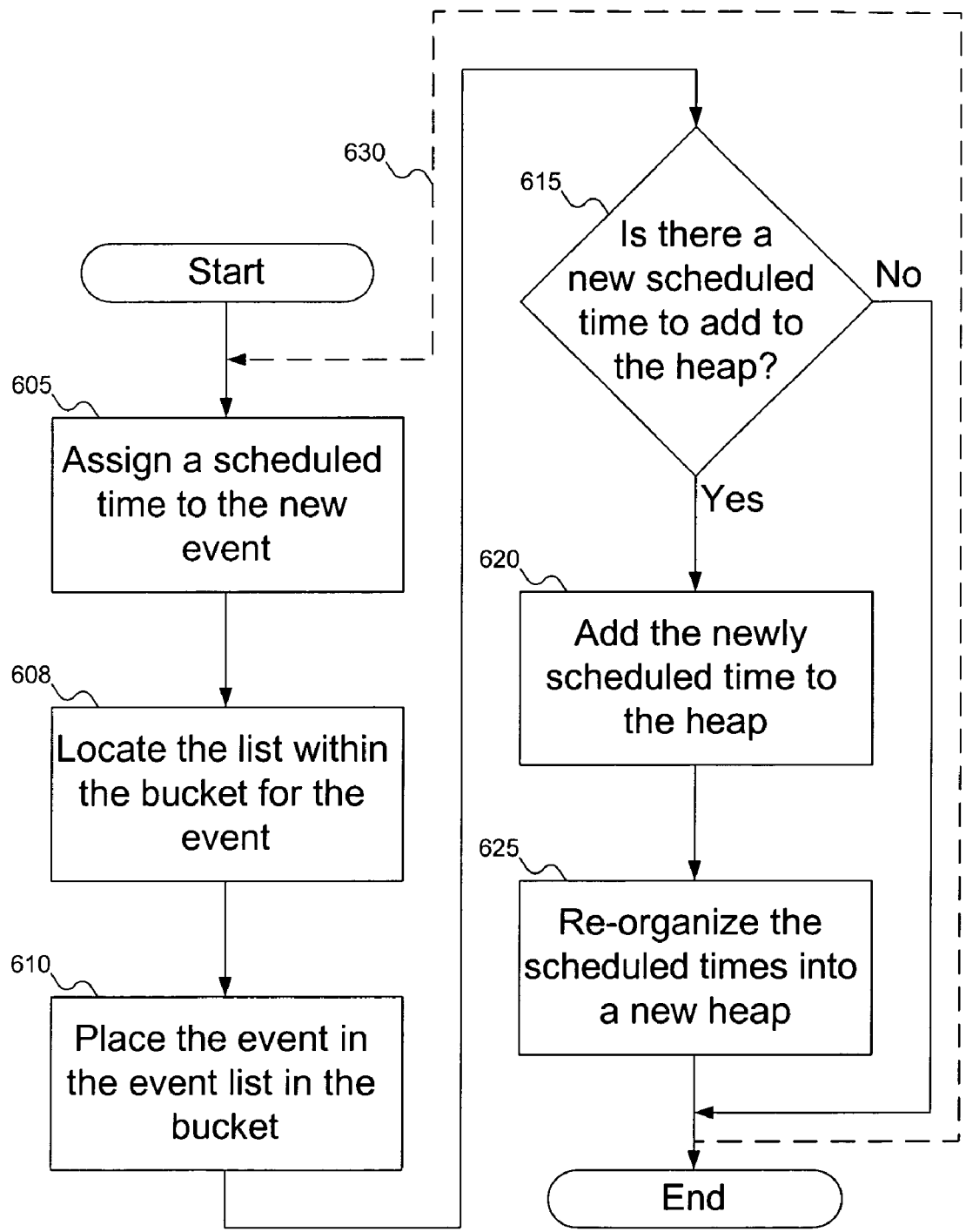
FIG. 6 shows how events can be added to the heap of FIG. 1.

FIG. 6 shows the process used to add new scheduled events. FIG. 6 is used when new events need to be scheduled after the process of emptying the heap has begun. Effectively, FIG. 6 is an interrupt of the loop of steps 520, 522, 525, and 530 of FIG. 5. FIG. 6 (as well as FIGS. 7 and 8) is not specifically directed toward scheduling new simulation events, but as discussed above, the process of FIG. 6 can be applied to simulation events. At step 605, the new event is assigned a scheduled time. At step 608, the bucket storing the event list into which the event is to be added is located. At step 610, the new event is added to the event list in the located bucket. At decision point 615, the process checks to see if the new event needs to add a new scheduled time to the heap. If a new scheduled time is to be added to the heap, then at step 620 the newly scheduled time is added to the heap, and at step 625 the scheduled time are re-organized into a new heap. If more events are to be scheduled, the process can be repeated, as shown by dashed line 630.

Figure 8:
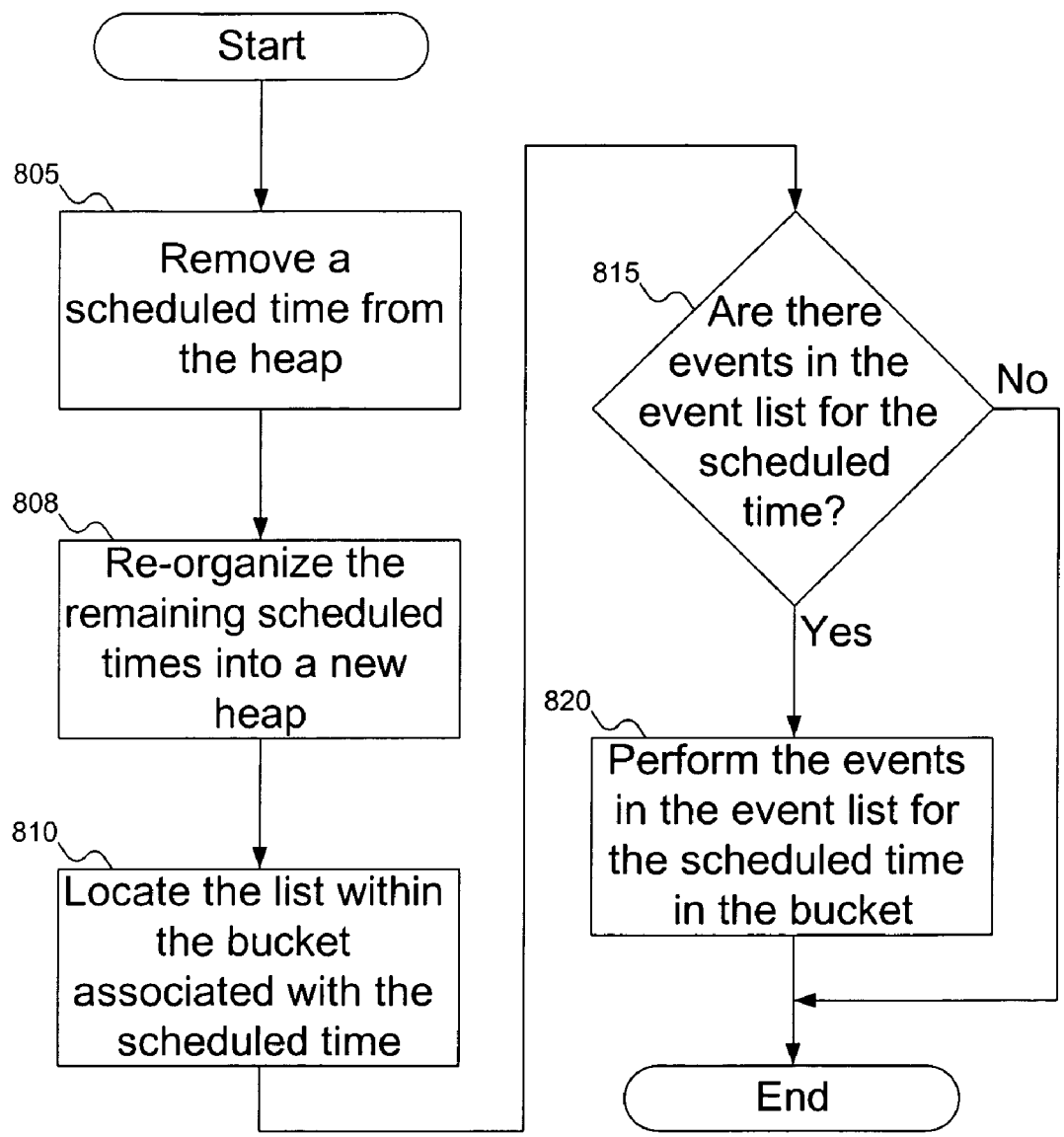
FIG. 8 shows how events are processed when their scheduled time is reached in the simulator of FIG. 1.
Figure 9:
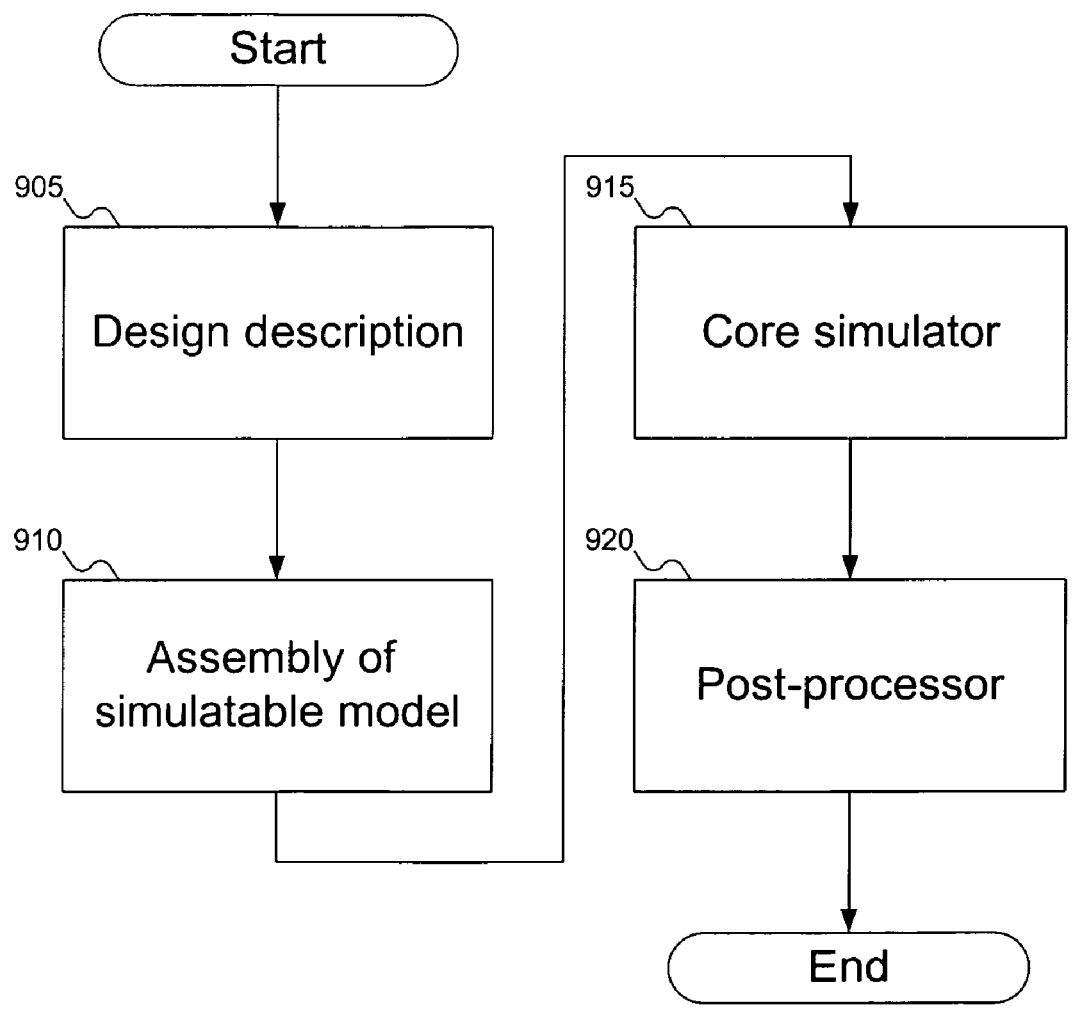
FIG. 9 shows the sequence of steps involved in performing a simulation.

FIG. 8 shows how events are processed when their scheduled time is reached in the simulator of FIG. 1. At step 805, a scheduled time is removed from the heap. At step 808, the remaining scheduled times in the heap are re-organized to restore the heap property. At step 810, the bucket associated with the selected scheduled time is located. Then, at decision point 815, the bucket is checked to see if there is an event list for the scheduled time. If an event list for the scheduled time exists, then at step 820 the events in the event list are performed.

Having described and illustrated the principles of the invention in a preferred embodiment thereof, it should be apparent that the invention can be modified in arrangement and detail without departing from such principles. I claim all modifications and variations coming within the spirit and scope of the following claims.

I claim:

1. A method for scheduling events occurring at scheduled times in a simulation model for modeling analog and mixed signal digital-analog physical circuits and systems in a digital computer, the method comprising:

assigning scheduled times to the events;
using a non-order preserving hash function based on the scheduled times of the events to store the events in buckets, each bucket containing at least one event;
wherein the buckets have no assigned order relative to one another;
associating the scheduled times assigned to the events in the buckets with the buckets;
organizing the scheduled times but not their events into a heap
wherein the heap comprises a binary tree of nodes that have a parent-child relationship, with a first node at one level higher than a second node being called a parent of the second node, and the second node being called a child of the first node, and each parent node having a smaller scheduled time than its two children;
removing an earliest scheduled time from the heap;
simulating the events in the bucket associated with the earliest scheduled time;
re-organizing the remaining scheduled times into a new heap; and
repeating the steps of removing a scheduled time, simulating the events, and re-organizing the remaining scheduled times until the heap is empty;
wherein the scheduled times are represented as real numbers.

2. A method according to claim 1, the method further comprising:
beginning the mixed-signal simulation;
determining the events from the mixed-signal simulation; and
determining the scheduled times for when the events are to occur.

3. A method according to claim 1, wherein simulating the events includes:
determining new events of the mixed-signal simulation;
determining the scheduled times for when the events are to occur; and
placing the new determined events into buckets using the hash function based on the scheduled times of the events.

4. A method according to claim 3, wherein placing the new determined events includes:
placing a first new determined event into a new bucket;
associating the scheduled time assigned to the first new determined event with the new bucket;
adding the new scheduled time associated with the new bucket to the heap; and
re-organizing the scheduled times into a new heap.

5. A method for scheduling events with associated scheduled times occurring at non-integral time intervals, the method comprising:
storing events in buckets according to their scheduled times;
wherein the buckets have no assigned order relative to one another; and
organizing the scheduled times into a structure, wherein the structure is constructed and arranged to allow easy location of an earliest scheduled time;
wherein the scheduled times are represented as real numbers.

6. A method according to claim 5, wherein storing events includes using a non-order preserving hash table to place the events into the buckets according to the scheduled times associated with the events.

7. A method according to claim 5, wherein each bucket is assigned a specific scheduled time and stores all events assigned that scheduled time.

8. A method according to claim 5, wherein the structure containing the scheduled times is organized as a heap.

9. A method according to claim 8, wherein the method further comprises:
removing a scheduled time from the heap; and
re-organizing the remaining scheduled times into a new heap.

10. A method according to claim 9, wherein removing a scheduled time includes performing the events in the bucket associated with the removed scheduled time.

11. A method according to claim 10, wherein performing the events includes checking to see if the bucket associated with the removed scheduled time is empty.

12. A method according to claim 5, wherein the method further comprises:
adding a new scheduled time to the heap; and
re-organizing the scheduled times into a new heap.

13. A method according to claim 5, wherein the method further comprises removing a de-scheduled event from a second bucket.

14. A computer-readable medium containing a program for scheduling events with associated scheduled times occurring at non-integral time intervals, the program comprising:
storage software to store events in buckets according to their scheduled times;
wherein the buckets have no assigned order relative to one another; and
organization software to organize the scheduled times into a structure, wherein the structure is constructed and arranged to allow easy location of an earliest scheduled time;
wherein the scheduled times are represented as real numbers.

15. A computer-readable medium containing a program according to claim 14, the storage software including hash software to use a non-order preserving hash table to place the events into the buckets according to the scheduled times associated with the events.

16. A system for scheduling events with associated scheduled times occurring at non-integral time intervals, the system comprising:
a computer;
a plurality of buckets stored in the computer, each bucket storing events to occur at a scheduled time;
wherein the buckets have no assigned order relative to one another; and
a structure organizing the scheduled times, wherein the structure is constructed and arranged to allow easy location of an earliest scheduled time;
wherein the scheduled times are represented as real numbers.

17. A system according to claim 16, wherein the structure containing the scheduled times is organized as a heap.

18. A system according to claim 16, wherein the computer includes a mixed-signal simulator for generating events and assigning times to generated events.

* * * * *